US008222928B2

(12) United States Patent
Bayerer

(10) Patent No.: US 8,222,928 B2
(45) Date of Patent: Jul. 17, 2012

(54) CIRCUIT ARRANGEMENT INCLUDING VOLTAGE SUPPLY CIRCUIT

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 12/571,088

(22) Filed: Sep. 30, 2009

(65) Prior Publication Data

US 2010/0134179 A1      Jun. 3, 2010

(30) Foreign Application Priority Data

Sep. 30, 2008   (DE) .................... 10 2008 049 676

(51) Int. Cl.
    *H03B 1/00*        (2006.01)
(52) U.S. Cl. ....................................... 327/108
(58) Field of Classification Search ................ None
    See application file for complete search history.

(56) References Cited

U.S. PATENT DOCUMENTS

| | | | | |
|---|---|---|---|---|
| 4,123,671 A * | 10/1978 | Aihara et al. | .................... | 326/80 |
| 4,511,815 A | 4/1985 | Wood | | |
| 4,683,438 A * | 7/1987 | Hauenstein | .................... | 323/288 |
| 4,843,252 A * | 6/1989 | Morokawa et al. | ........... | 327/108 |
| 5,066,873 A * | 11/1991 | Chan et al. | .................... | 326/27 |
| 5,180,928 A * | 1/1993 | Choi | .......................... | 327/541 |
| 5,396,114 A * | 3/1995 | Lee et al. | ....................... | 327/535 |
| 5,444,590 A | 8/1995 | LeComte et al. | | |
| 5,455,758 A | 10/1995 | Pelly | | |
| 5,736,877 A * | 4/1998 | Tihanyi | .......................... | 327/77 |
| 5,892,390 A * | 4/1999 | Tobita | .......................... | 327/543 |
| 5,917,221 A * | 6/1999 | Takemura | ..................... | 257/365 |
| 6,034,563 A * | 3/2000 | Mashiko | ....................... | 327/544 |
| 6,147,887 A * | 11/2000 | Miettinen | ..................... | 363/98 |
| 6,169,392 B1 * | 1/2001 | Kitagawa | ..................... | 323/282 |
| 6,452,441 B1 * | 9/2002 | Kim et al. | ..................... | 327/544 |
| 6,657,399 B2 | 12/2003 | Adams et al. | | |
| 7,102,416 B2 * | 9/2006 | Finney | .......................... | 327/434 |
| 7,324,358 B2 * | 1/2008 | Fujiwara | ....................... | 363/60 |
| 7,405,596 B2 * | 7/2008 | Tanimoto | ...................... | 326/83 |

(Continued)

FOREIGN PATENT DOCUMENTS

DE            3124891 A1      1/1983

(Continued)

OTHER PUBLICATIONS

F. Tofoli et al., "A High Power Factor Power Supply Employing a Self-Oscillating Converter to Supply Control Circuitry", 2004 35th Annual IEEE Power Electronics Specialists Conference, Aachen, Germany, 2004, pp. 2600-2603.

(Continued)

*Primary Examiner* — Thomas J Hiltunen
(74) *Attorney, Agent, or Firm* — Dicke, Billig & Czaja, PLLC

(57) ABSTRACT

One embodiment of a circuit arrangement includes first and second input voltage terminals for applying an input voltage, and at least one first semiconductor switching element having a drive terminal and a load path, the load path being connected between the input voltage terminals. A drive circuit is configured to receive a supply voltage, and has a drive output connected to the drive terminal of the at least one semiconductor switching element. A free-running oscillator is configured to generate an oscillating output voltage. A voltage supply circuit is provided for receiving the oscillating output voltage or a voltage dependent on the oscillating output voltage, and for providing the supply voltage of the drive circuit.

14 Claims, 11 Drawing Sheets

U.S. PATENT DOCUMENTS

| | | | |
|---|---|---|---|
| 7,944,131 B2 * | 5/2011 | Kawashima | 310/370 |
| 7,944,250 B2 * | 5/2011 | Jansen | 327/108 |
| 2006/0181361 A1 * | 8/2006 | Van De Gevel et al. | 331/158 |
| 2007/0210774 A1 * | 9/2007 | Kimura et al. | 323/282 |
| 2008/0174377 A1 * | 7/2008 | Makuta et al. | 331/116 R |
| 2010/0026403 A1 * | 2/2010 | Rana et al. | 331/116 R |

FOREIGN PATENT DOCUMENTS

| | | |
|---|---|---|
| DE | 4021385 | 1/1992 |
| DE | 4441492 A1 | 5/1996 |
| DE | 19963330 C1 | 9/2000 |
| DE | 19954538 A1 | 5/2001 |
| DE | 19910327 C2 | 11/2001 |
| DE | 10027088 C2 | 5/2003 |
| EP | 0784376 B1 | 7/2003 |
| EP | 0751570 B1 | 8/2003 |
| EP | 0998018 B1 | 12/2003 |
| EP | 1143619 B1 | 7/2005 |
| EP | 0868014 B1 | 8/2008 |

OTHER PUBLICATIONS

IF2152: "Self-Oscillating Half-Bridge Driver", International Rectifier, http://www.irf.com/, Mar. 29, 2001, pp. 1-6.

B. Strzalkowski, "Neue Moglichkeiten der Systemintegration in der Leistungselektronik mittels planarer integrierter Mikrotransformatoren" (6 pages).

* cited by examiner

CIRCUIT ARRANGEMENT INCLUDING VOLTAGE SUPPLY CIRCUIT

CROSS-REFERENCE TO RELATED APPLICATIONS

This Utility patent application claims priority to German Patent Application No. DE 10 2008 049 676.6-31, filed on Sep. 30, 2008, and incorporated herein by reference.

BACKGROUND

Semiconductor switching elements are increasingly being used as switches for switching electrical loads. Such semiconductor switching elements are e.g., MOS transistors, such as MOSFET or IGBT. A drive circuit serves for driving a semiconductor switching element in the on-state or in the off-state, said drive circuit being connected to a drive terminal of the semiconductor switching element and generating a drive signal for driving the semiconductor switching element in the on-state or in the off-state. In order to generate said drive signal, the drive circuit requires a supply voltage.

The generation of a supply voltage for a drive circuit of a semiconductor switching element can be effected using bootstrap circuits, for example.

For these and other reasons there is a need for the present invention.

SUMMARY

One embodiment relates to a circuit arrangement having: first and second input voltage terminal for applying an input voltage; at least one first semiconductor switching element having a drive terminal and a load path, the load path being connected between the input voltage terminals. A drive circuit is provided, having supply terminals for applying a supply voltage and having a drive output the drive output being connected to the drive terminal of the at least one semiconductor switching element. A free-running oscillator having supply terminals and an oscillator output, the oscillator output being connected between the input voltage terminals by using its supply terminals, and the oscillator being designed to generate an oscillating output voltage at the oscillator output. A voltage supply circuit is provided having input terminals for receiving the oscillating output voltage or a voltage dependent on said oscillating output voltage and having output terminals for providing the supply voltage of the drive circuit.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Examples are explained below with reference to figures. The main emphasis is on explaining the basic principle. Consequently, only the circuit components and signals necessary for understanding this basic principle are illustrated in the figures. In the figures, unless indicated otherwise, identical reference symbols designate identical parts with the same meaning.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
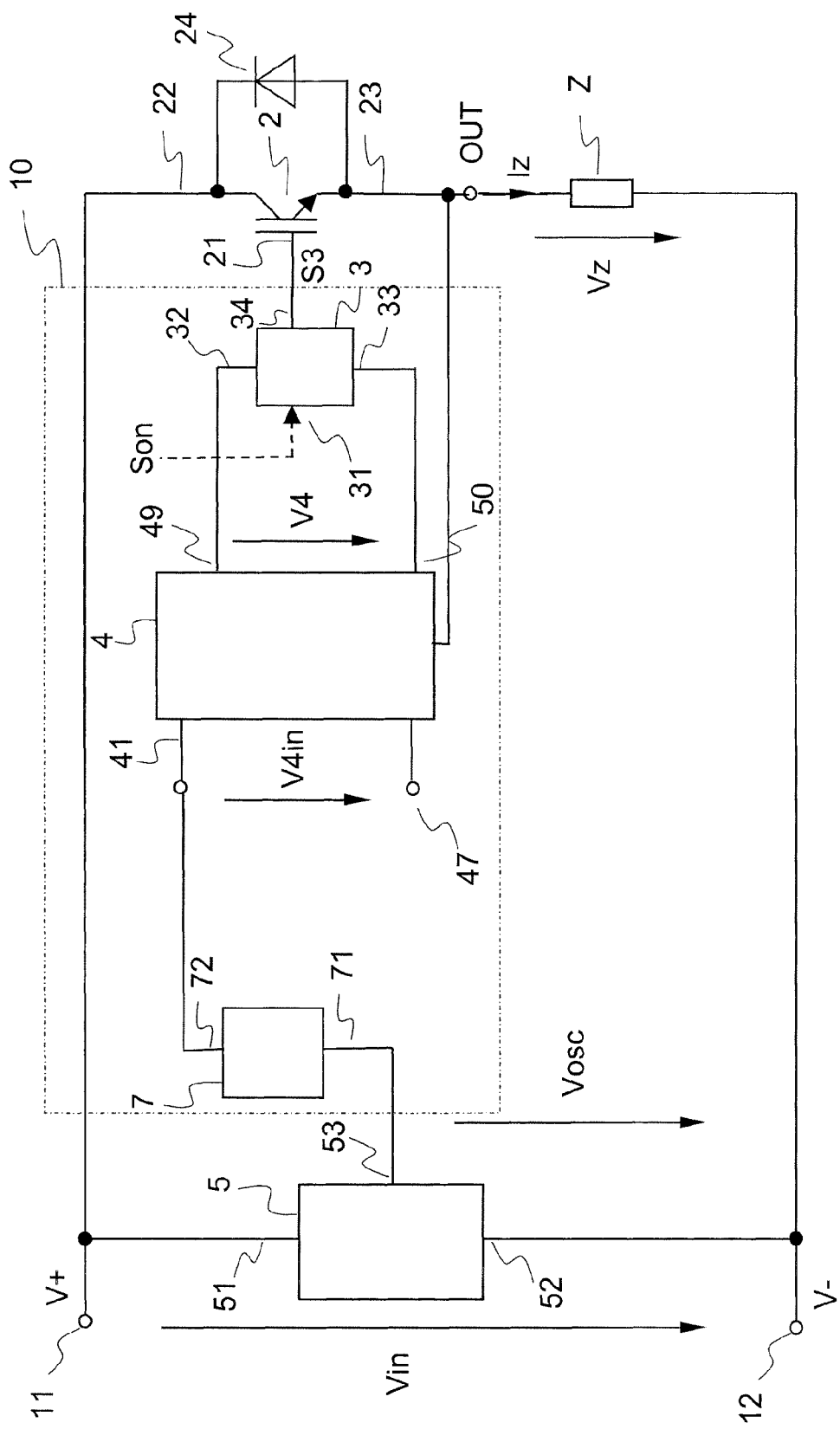
FIG. 1 illustrates a first embodiment of a circuit arrangement having a semiconductor switching element, a drive circuit for the semiconductor switching element, a voltage supply circuit for the drive circuit, and a free-running oscillator.

FIG. 1 illustrates an example of a circuit arrangement having input voltage terminals 11, 12 for applying an input voltage Vin, a semiconductor switching element 2 having a control terminal 21 and first and second load path terminals 22, 23, and a drive circuit 3 for the semiconductor switching element 2. The drive circuit 3 includes supply terminals 32, 33 for applying a supply voltage V4 and an output terminal 34 for providing a drive signal S3 for the semiconductor switching element 2, the output terminal being connected to the drive terminal 21 of the semiconductor switching element 2. In the illustrated in FIG. 1, the supply voltage V4 of the drive circuit 3 is derived, in a manner that will be explained below, from the input voltage Vin present between the input voltage terminals 11, 12.

In the circuit arrangement illustrated, the first input voltage terminal 11 is at an upper supply potential, which hereinafter is also referred to as positive supply potential, and the lower input voltage terminal 12 is at a lower supply potential V−, which hereinafter is also referred to as negative supply potential. The input voltage Vin can have a magnitude of a few hundred volts or a few kV, e.g., 600V, depending on the power supply voltage and is, for example, an intermediate circuit voltage (DC link voltage). The semiconductor switching element is, for example, a power semiconductor switching element having a blocking voltage capability (maximum blocking voltage) that is high enough for the switching element to reliably block the input voltage Vin. Depending on the level of the input voltage Vin and the type of load to be switched, the semiconductor switching element has for example a blocking voltage capability of higher than 100V, such as 600V, 1200V, 1700V, 3300V or 6500V. This applies to other power semiconductor switching elements that will be explained in the following as well.

The semiconductor switching element 2 has a load path running between the first and second load path connections 22, 23. In the example illustrated, the said load path 22-23 is connected in series with a load Z, with the series circuit including the semiconductor switching element 2 and the load Z being connected between the input voltage terminals 11, 12. The semiconductor switching element 2 serves as a switch for switching a load current Iz flowing through the load Z. The semiconductor switching element 2 is driven in the on-state (switched on) and in the off-state (i switched off) dependent on the drive signal S3 generated by the drive circuit 3. The drive signal S3 is generated for example depending on a switching signal Son fed to the drive circuit 3, the switching signal being generated by a central control circuit (not illustrated), for example. The control circuit may be galvanically isolated (decoupled) from the drive circuit 3, i.e., a potential barrier may be arranged between the control circuit and the drive circuit 3.

In the example illustrated, the semiconductor switching element 2 is an IGBT having a gate terminal as drive terminal 21, and drain and source terminals or collector and emitter terminals as first and second load path terminals 22, 23. A freewheeling element 24, such as e.g., a freewheeling diode, is optionally connected in parallel with the drain-source path of said IGBT. It should be understood that the use of an IGBT as semiconductor switching element 2 should be understood merely as an example. It goes without saying that any further semiconductor switching element, such as e.g., power MOSFET, can be used as semiconductor switching element 2.

For the IGBT 2 illustrated—as well as for an n-channel power MOSFET (not illustrated)—the drive signal S3 is a drive voltage between the gate terminal 21 and the source terminal 23. In order to provide this drive voltage, the drive circuit 3 requires the supply voltage V4 present between its supply terminals 32, 33.

In order to provide said supply voltage V4, the circuit arrangement illustrated has a voltage supply circuit 4 having input terminals 41, 47 for applying an input voltage V4 in and output terminals for providing the supply voltage V4. In order to provide the input voltage V4 in of the voltage supply circuit 4, the circuit arrangement includes a free-running oscillator 5 having supply terminals 51, 52, via which the oscillator 5 is connected between the input voltage terminals 11, 12, and having an oscillator output 53 for providing an oscillating output voltage Vosc. In the example illustrated, said oscillating output voltage Vosc is fed to the voltage supply circuit 4 as input voltage V4 in via a coupling circuit 7.

Figure 2:
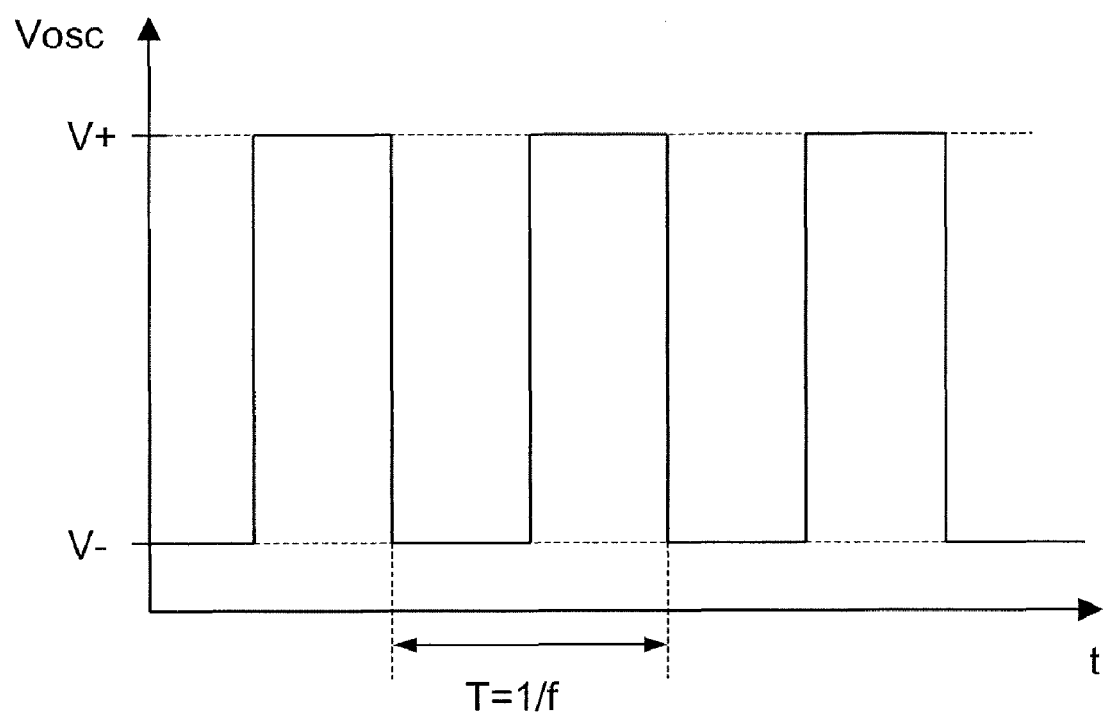
FIG. 2 illustrates one embodiment of a timing diagram of an output voltage of the oscillator.

The free-running oscillator 5 is configured to generate an oscillating output voltage Vosc as soon as an input voltage Vin that is not equal to zero is present between the supply terminals 51, 52 of said oscillator. FIG. 2 illustrates an example of the timing diagram of said oscillator voltage Vosc. In the example illustrated, the oscillator voltage Vosc is a rectangular-waveform voltage that oscillates periodically between the positive supply potential V+ and the negative supply potential V−. In the case of the circuit arrangement illustrated in FIG. 1, the oscillator voltage Vosc is referred to the second input terminal 12, which is at the negative supply potential V−. The magnitude of the oscillator voltage Vosc corresponds to the input voltage Vin if the positive supply potential V+ is present at the oscillator output 53, and the magnitude of the oscillator voltage Vosc is zero if the negative supply potential V− is present at the oscillator output 53. The period duration of the oscillator voltage Vosc is designated by T in FIG. 2. f=1/T designates the frequency of the oscillator voltage Vosc.

In the example illustrated in FIG. 2 time durations during which the output voltage Vosc of the oscillator 5 assumes an upper signal level (V+) and during which the output voltage Vosc of the oscillator 5 assumes a lower voltage level (V−) have the same lengths. However, this is only an example. The output signal Vosc could also be a non-symmetrical signal, i.e., a signal in which time durations of the upper signal level are different from time durations of the lower signal level. Further, the edges during the transition between the two signal levels are idealized to be vertical edges. In reality these edges have a finite gradient. In this connection it should be noted that the rising edges and the falling edges of the output signal Vosc may also have different gradients.

The oscillator voltage Vosc illustrated in FIG. 2 is symmetrical to the effect that time durations during which the positive supply potential V+ is present at the oscillator output 53 correspond to the time durations during which the negative supply voltage V− is present at the oscillator output 53. It should be noted that this should be understood merely as an example. The generation—explained in even greater detail below—of the supply voltage V4 from the oscillator voltage Vosc functions in a corresponding manner also for an asymmetrical oscillator voltage and also for oscillator voltages Vosc which do not have rectangular voltage profiles but rather have for example trapezoidal voltage profiles or other voltage profiles having any desired voltage edges.

Figure 3:
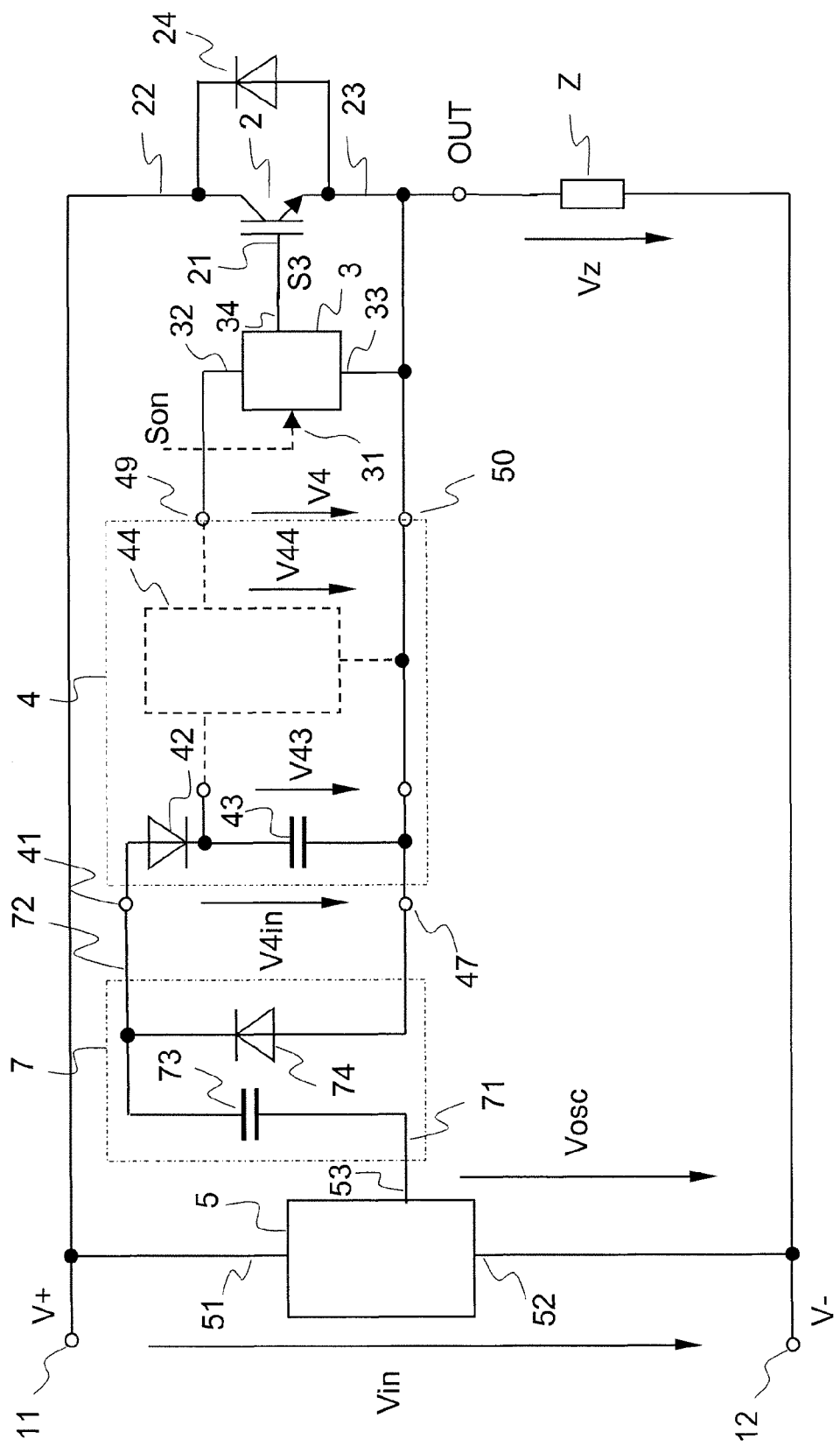
FIG. 3 illustrates one embodiment of a voltage supply circuit and a of a coupling circuit connected between the oscillator and the voltage supply circuit.

In order to afford a better understanding of the basic principle of the present circuit arrangement, FIG. 3 illustrates a first example of a voltage supply circuit 4 and also a first example of a coupling circuit 7. The voltage supply circuit 4 illustrated includes a first series circuit including a first rectifier element 42, for example a diode, and a first capacitive storage element 43, for example a capacitor, the first series circuit being connected between the input terminals 41, 47 of the voltage supply circuit 4. This series circuit functions in the manner of a peak rectifier. In the example illustrated, the coupling circuit 7 is a capacitive coupling circuit having a capacitive coupling element 73, for example a capacitor, which is connected between the oscillator output 53 and a first 41 of the input terminals 41, 47 of the voltage supply circuit 4.

In the case of the voltage supply circuit 4 illustrated in FIG. 3, the supply voltage V4 is a voltage that is referred to the second load path terminal 23 or the electrical potential at the second load path terminal 23. For this purpose, one of the output terminals of the voltage supply circuits 4 is connected to the second load path terminal 23 of the semiconductor switching element 2. The input voltage V4 in is accordingly a voltage referred to the second load path potential. For this purpose, the second input terminal 47 is likewise connected to the second load path terminal 23 of the semiconductor switching element 2.

In the case of the example illustrated, the supply voltage V4 of the voltage supply circuit 4 is the electrical voltage V43 present across the first capacitive storage element 43. A first voltage regulator 44 is optionally present. This voltage regulator is connected between the first capacitive storage element 43 and the output terminals of the voltage supply circuit 4 and is designed to generate a regulated voltage V44 from the voltage V43 present across the first capacitive storage element 43, said regulated voltage being available as supply voltage V4 at the output terminals of the voltage supply circuit 4. The first voltage regulator 44 may be any known voltage regulator, in one embodiment a linear regulator or a switching regulator. Furthermore, there is also the possibility of using a charge pump as voltage regulator 44, the charge pump converting the voltage V43 present across the first capacitive storage element 43 to a higher voltage V44.

The functioning of the circuit arrangement illustrated in FIG. 3 is briefly explained below. For the purpose of the explanation it shall be assumed that the semiconductor switching element 2 is initially turned off. In this case, the second load path terminal 23 is at the negative supply potential V−. During a time duration during which the positive supply potential V+ is present at the oscillator output 53, the entire input voltage Vin is present across the series circuit including the capacitive coupling element 73 and the first capacitive storage element 43. If the forward voltage of the rectifier element 42 is neglected, then the voltage V43 at the first capacitive storage element 43 is related to the input voltage, a relationship between the input voltage Vin and the voltage at the first capacitive storage element 43 being given by the divider ratio of a capacitive voltage divider formed by the capacitive coupling element 73 and the first capacitive storage element 43. For said voltage V43, which corresponds to the input voltage V4 in when the forward voltage of the rectifier element 42 is neglected, the following applies:

$$V43 = \frac{C73}{C73 + C43} \cdot Vin \quad (1)$$

Here C73 designates the capacitance value of the capacitive coupling element 73, and C43 designates the capacitance value of the first capacitive storage element 43. The forward voltage of a rectifier element 42 embodied as a bipolar diode is in the region of 0.7V, for example. This forward voltage is negligible in comparison with the voltage V43 present at the first capacitive storage element 43, and even more so in comparison with the input voltage Vin.

A drive voltage S3 for driving the semiconductor switching element in the on-state is between 10V and 20V, for example, if the blocking voltage capability of the semiconductor switching element is between a few 100V and a few 1000V.

The supply voltage V4 required for generating such a drive voltage S3 lies in the same range. In one example, the voltage V43 provided at the first capacitive storage element 43 is 15V and the input voltage is 600V. In this case, the divider ratio of the capacitive voltage divider 73, 43 is chosen such that it is 40:1.

The first capacitive storage element 43 is charged whenever the positive supply potential V+ is available at the oscillator output 53. In order to discharge the first capacitive coupling element 73 into the initial state if the potential at the output 53 of the oscillator 5 falls to the negative supply potential V− a further rectifier element 74, such as e.g., a diode, is connected between the second input terminal 47 or the second load path terminal 23 of the semiconductor switching element 2 and that terminal of the capacitive coupling element 73 which is remote from the oscillator output 53. Said further rectifier element 74 is oppositely polarized such that the capacitive coupling element 73, which is charged when the positive supply potential V+ is present at the oscillator output 53, is discharged in when the negative supply potential V− is subsequently present at the oscillator output 53.

The capacitance value of the first capacitive storage element 43 and the power consumption of the drive circuit 3 can be adapted to one another in such a way that even after the positive supply potential V+ has been present once at the oscillator output 53, enough energy is stored in the capacitive storage element 43 to enable the semiconductor switching element 2 to be driven.

If a voltage regulator 44 is present, and if the voltage regulator has a charge pump, for example, which discharges the capacitive storage element 43 in favor of a capacitor (not illustrated) present in the voltage regulator 44 in order to ensure the voltage supply of the drive circuit 3 via said capacitor, then a plurality of clock cycles of the oscillator output signal Vosc may be necessary until a sufficient supply voltage V4 for the drive circuit 3 is available at the output of the voltage supply circuit 4.

The input voltage Vin, which determines the voltage V43 at the capacitive storage element 43, may be subject to fluctuations. If the voltage regulator 44 does not have a charge pump, then the divider ratio of the capacitive voltage divider should be chosen such that, in the case of a minimum value to be expected for the input voltage Vin, the voltage V43 at least still corresponds to the voltage required for the supply of the drive circuit 3, or is higher.

If the semiconductor switching element 2 is driven in the on-state by the drive circuit 3 once a sufficient supply voltage V4 is available, then the electrical potential at the second load path terminal 23 rises approximately to the value of the upper supply potential V+. For driving the semiconductor switching element 2 in the on-state, electrical energy is drawn from the capacitive storage element 43. The capacitor 43 is recharged in this operating state as follows: the first coupling capacitance 73 is charged in each case during those time durations during which the negative supply potential V− is present at the output of the oscillator 5. Afterwards, if the positive supply potential V+ is present at the output of the oscillator 5, said coupling capacitance 73 is at least partly discharged by at least part of the previously stored charge flowing into the capacitive storage element 43. In the case where the semiconductor switching element is driven in the on-state, the oscillator 5, the capacitive coupling element 73 and the further rectifier element 74 function like a charge pump or form such a charge pump for the capacitive storage element 43.

In the case of the circuit arrangement illustrated, the capacitive storage element 43 is thus recharged both when the semiconductor switching element 2 is in the on-state and when the semiconductor switching element 2 is in the off-state.

In one example, the semiconductor switching element 2 is driven in clocked fashion with a first frequency f1. Such clocked driving is effected for example when the semiconductor switching element 2 serves for driving inductive loads Z, such as e.g., an electric motor, a solenoid valve or an inductance in a switched-mode power supply, or when the semiconductor switching element is part of a converter to be explained below. An oscillator frequency $f_{osc}$ that is to say a frequency of the oscillator voltage Vosc, is in this case for example greater than the switching frequency of the semiconductor switching element. The ratio $f_{osc}/f1_{max}$ between the oscillator frequency and a maximum switching frequency is chosen for example such that it is between 2 and 10. In this way, even when the semiconductor switching element is operated with its maximum switching frequency, a plurality of clock cycles of the oscillator voltage Vosc are present during which the first capacitive storage element V43 is recharged. This ensures a sufficient recharging of the capacitive storage element 43 between two switching operations of the semiconductor switching element 2. In this connection, a switching operation is a transition of the semiconductor switching element from the on-state to the off-state, or vice versa. The current consumption of the drive circuit 3 is high in one embodiment during such switching operations, such that a sufficient recharging of the storage capacitance should be ensured between the switching operations.

Figure 4:
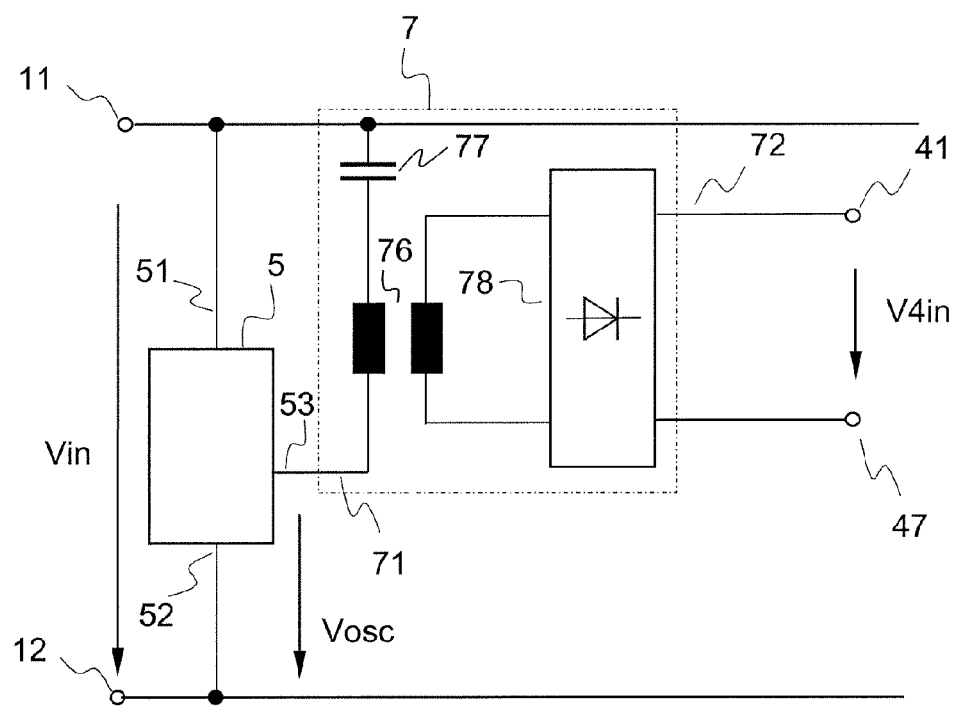
FIG. 4 illustrates a second embodiment of a coupling circuit.

FIG. 4 illustrates a further example of a coupling circuit 7 connected between the oscillator output 53 and the input terminals 41, 47 of the voltage supply circuit 4. The coupling circuit illustrated in FIG. 4 is an inductive coupling circuit and has a transformer 76 having a primary winding and a secondary winding. In the example illustrated, the primary winding is connected in series with a capacitance 77 between the oscillator output 53 and one of the input voltage terminals, the first input voltage terminal 11 in the example. The transformer may include a transformer core, but may also be a coreless transformer. The secondary winding of the transformer is inductively coupled to the primary winding and is connected to a rectifier arrangement 78, for example a bridge rectifier, which has output terminals for providing the input voltage V4 in of the voltage supply circuit 4.

With each change in the voltage across the primary winding of the transformer 76, a voltage is induced in the secondary winding of the transformer. This voltage induced in the secondary winding is rectified by the bridge rectifier 78 and made available to the voltage supply circuit 4 as input voltage Vin. The capacitance 77 connected in series with the primary winding prevents a DC current through the primary winding, but constitutes a short circuit for the AC voltage generated by the oscillator 5.

Figure 5:
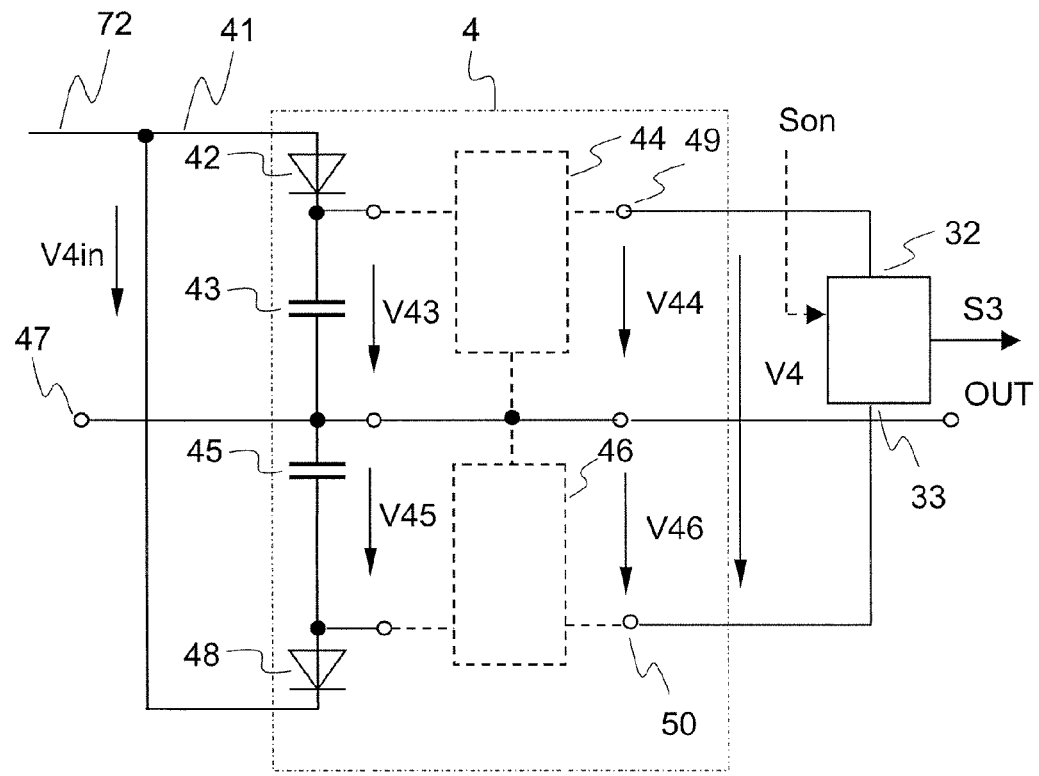
FIG. 5 illustrates a second embodiment of the voltage supply circuit.

FIG. 5 illustrates another embodiment of a voltage supply circuit 4. This voltage supply circuit differs from the voltage supply circuit illustrated in FIG. 3 in that a second series circuit including a second rectifier element 48, for example a diode, and a second capacitive storage element 45, for example a capacitor, is present, which are connected between the input terminals 41, 47 of the voltage supply circuit 4. In the case of this voltage supply circuit, the first and the second capacitive storage element 43, 45 are jointly connected to the second input terminal 47, which is connected to the second load path terminal 23 of the semiconductor switching element 2 in the manner already explained. The second rectifier element 48 is oppositely polarized with respect to the first rectifier element 42.

In the case of this voltage supply circuit 4, the first capacitive storage element 43 is charged when the input voltage V4 in is a positive voltage, while the second capacitive storage element 45 is charged when the input voltage V4 in is a negative voltage. If the coupling circuit is a capacitive coupling circuit, as was explained for example with reference to FIG. 3, then a negative input voltage V4 in occurs in each case when the potential at the oscillator output 53 changes from the positive supply potential to the negative supply potential. In this case, the previously charged coupling capacitance 73 is discharged for the second rectifier element 48 in the direction of the second capacitive storage element 45, from which a negative voltage V45 relative to the second input terminal 47 results across the second capacitive storage element 45. When a voltage supply circuit 4 in accordance with FIG. 5 is used in connection with a capacitive coupling circuit 7 such as was explained with reference to FIG. 3, the rectifier element 74 illustrated in FIG. 3 may be omitted in the coupling circuit 7. A discharging of the coupling capacitance 73 that is ensured by the rectifier element 74 is effected by using the second rectifier element 48 in the case of the voltage supply circuit 4 illustrated in FIG. 5.

When an inductive coupling circuit is used in connection with the voltage supply circuit 4 in accordance with FIG. 5, the rectifier 78 may be omitted. In this case, positive voltage pulses across the secondary winding feed the first rectifier element 43, and negative voltage pulses feed the second rectifier element 45.

The sum of the voltages V43, V45 across the two capacitive storage elements 43, 45 may be output directly as supply voltage V4. Voltage regulators 44, 46 are optionally present, which process said voltages V43, V45 further and thereby generate regulated voltages V44, V46 respectively referred to the second input terminal 47 or the second load path terminal 23 of the semiconductor switching element 2. The voltage regulators 44, 46 may be any desired voltage regulators that are known in principle, such as e.g., linear regulators or switching regulators. Furthermore, charge pumps may also be used as voltage regulators 44, 46. It is also possible to process further only one of the two voltages at the capacitive storage elements, and to use the other voltage in unregulated fashion.

In the case of the voltage supply circuit 4 illustrated in FIG. 3, one of the output terminals corresponds to the second input terminal 47 and thus to the second load path terminal 23 of the semiconductor switching element 2. In the case of this voltage supply circuit 4, the output voltage V4 is a positive voltage relative to said second load path terminal 23. In the case of the voltage supply circuit 4 illustrated in FIG. 5, the second input terminal 47 and the second output terminal of the voltage supply circuit 4 differ. In the case of this voltage supply circuit 4 in accordance with FIG. 5, a positive supply potential relative to the second load path potential is available at the first output terminal 49, and a negative supply potential relative to the second load path potential 23 is available at the second output terminal 50. When the voltage supply circuit 4 in accordance with FIG. 5 is used for the voltage supply of the drive circuit 3, which is likewise illustrated in FIG. 5, the drive circuit 3 can generate positive drive voltages S3 for driving the semiconductor switching element 2 in the on-state and negative drive voltages for driving the semiconductor switching element 2 in the off-state. A more rapid turn-off of the semiconductor switching element 2 may be ensured by using negative drive voltages—in comparison with a drive voltage of zero as in the case of the drive circuit in accordance with FIG. 3.

Figure 6:
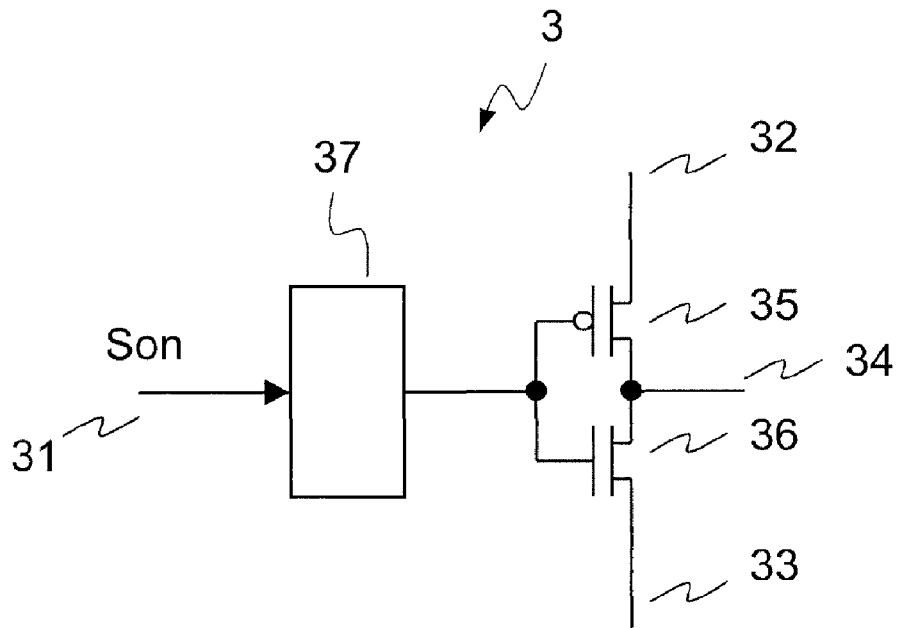
FIG. 6 illustrates one embodiment of a drive circuit.

FIG. 6 illustrates one embodiment of a drive circuit 3. This drive circuit 3 includes a half-bridge having two complementary transistors 35, 36 that have their load paths connected between the supply terminals 32, 33 of the drive circuit 3. A terminal that is common to the load paths of these two transistors 35, 36 forms the output terminal 34 of the drive circuit 3. The two transistors 35, 36 are both driven by a control circuit 37. By way of example, the switching signal Son is fed to the control circuit 37. In the case of a high level at the output of the control circuit 37, in the example illustrated, the lower transistor 36 of the two transistors 35, 36 is turned on, whereby the drive voltage of the semiconductor switching element 2 is either zero or negative depending on the realization of the voltage supply circuit 4. In the case of a low level at the output of the control circuit 37, in the example illustrated, the upper transistor 35 of the two transistors is turned on, such that the drive voltage is a positive voltage. The control circuit 37 is designed, in one embodiment, for converting the switching signal Son to levels suitable for driving the two transistors 35, 36. Furthermore, in a manner not illustrated in more specific detail, protection functions for the semiconductor switching element may be realized in the control circuit 37. Thus, the drive circuit 37 can be designed, for example, to turn off the semiconductor switching element 2 in the case of an overtemperature.

Figure 7:
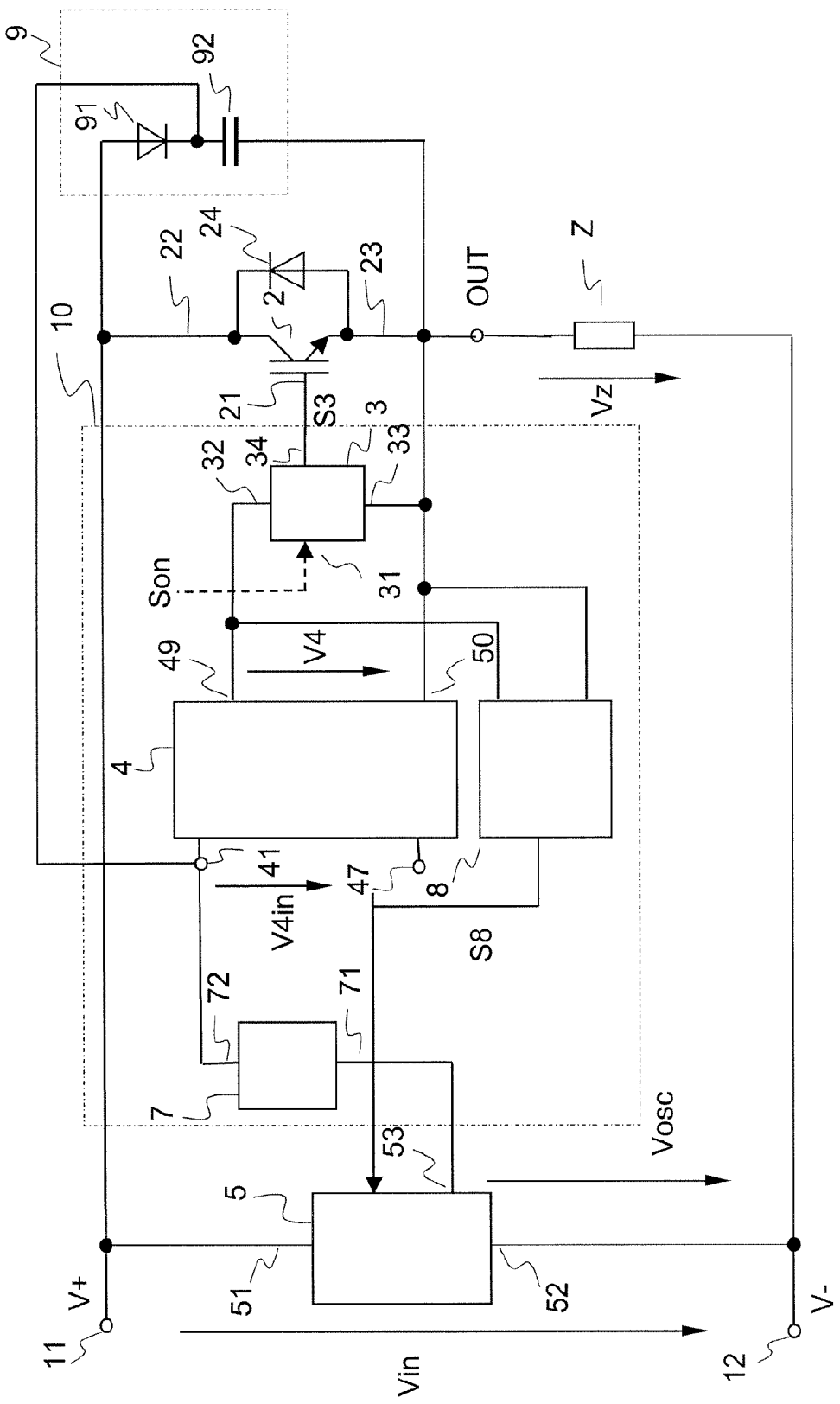
FIG. 7 illustrates a further embodiment of a circuit arrangement, which has a deactivation circuit for deactivating the oscillator.

FIG. 7 illustrates an example of a circuit arrangement having, in addition to the circuit components already explained above, a deactivation circuit 8, which is designed to deactivate the oscillator 5 depending on the supply voltage V4 present at the output terminals 49, 50 of the voltage supply circuit 4.

Figure 8:
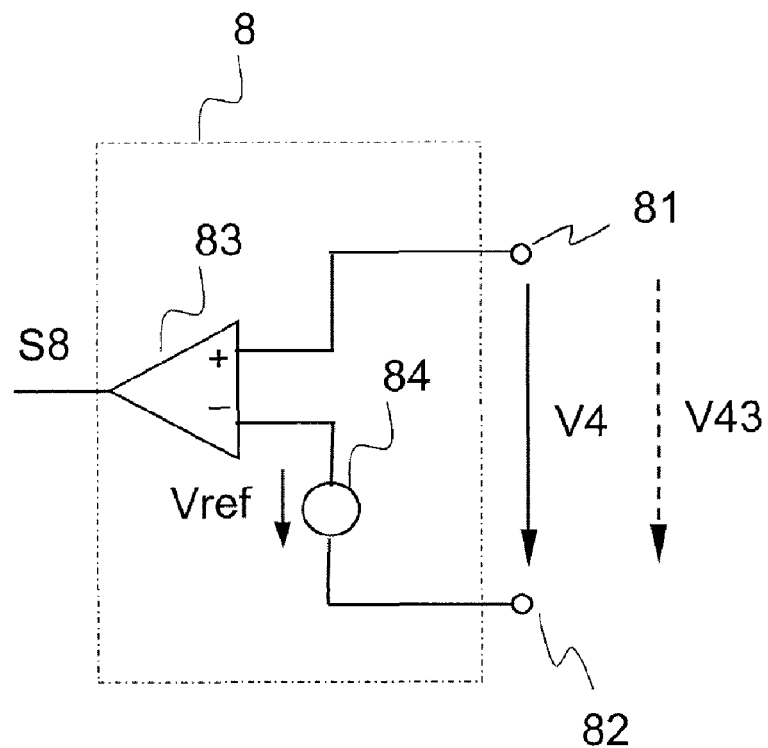
FIG. 8 illustrates one embodiment of the deactivation circuit.

Referring to FIG. 8, in one embodiment deactivation circuit 8 includes a comparator 83, for example, to which a difference between the supply voltage V4 and a reference voltage Vref provided by a reference voltage source 84 is fed as an input voltage. A deactivation signal S8 is available at the output of said comparator 83, the deactivation signal, referring to FIG. 7, being fed to the oscillator 5. The oscillator 5 is deactivated each time when the deactivation signal S8 assumes a deactivation level. In the example illustrated, the deactivation signal S8 assumes a deactivation level—a high level in the example—each time when the supply voltage V4 exceeds the reference voltage Vref. In the deactivated state, the oscillator 5 does not provide an oscillating output voltage Vosc. In this case, the oscillator output 53 is at a fixedly predetermined potential, for example, such as e.g., the negative supply potential V−.

The reference voltage Vref is chosen such that the supply voltage V4 has an amplitude sufficient for voltage supplying the drive circuit 3 if the supply voltage V4 reaches the value of the reference voltage Vref. Turning off the oscillator 4 each time when a sufficient supply voltage V4 is available for the drive circuit 3 helps to reduce the power loss of the circuit arrangement.

In order to ensure a voltage supply of the drive circuit 3 when oscillator 5 is deactivated, the voltage supply circuit in the case of the circuit arrangement in accordance with FIG. 7 has a charge pump 8 connected between the first input 41 and the output OUT or the terminal for the positive supply potential V+. Said charge pump includes a series circuit including a rectifier element 91, e.g., a diode, and a capacitive storage element 92, said series circuit being connected between the terminal for the positive supply potential V+ and the output OUT. A node common to the rectifier element 91 and the capacitive storage element 92 is in this case connected to the first input 41. If the semiconductor switching element 2 is driven in clocked fashion, then the capacitive storage element 92 is charged with the clock timing of the driving of the semiconductor switching element 2 and subsequently discharged in favor of the capacitive storage element (43 in FIG. 2) of the drive circuit 4.

Such a charge pump can be provided independently of whether the oscillator 5 can be turned off. In the case of circuits in which the oscillator is permanently activated, the charge pump 8 supports the generation of the supply voltage V4.

Figure 9:
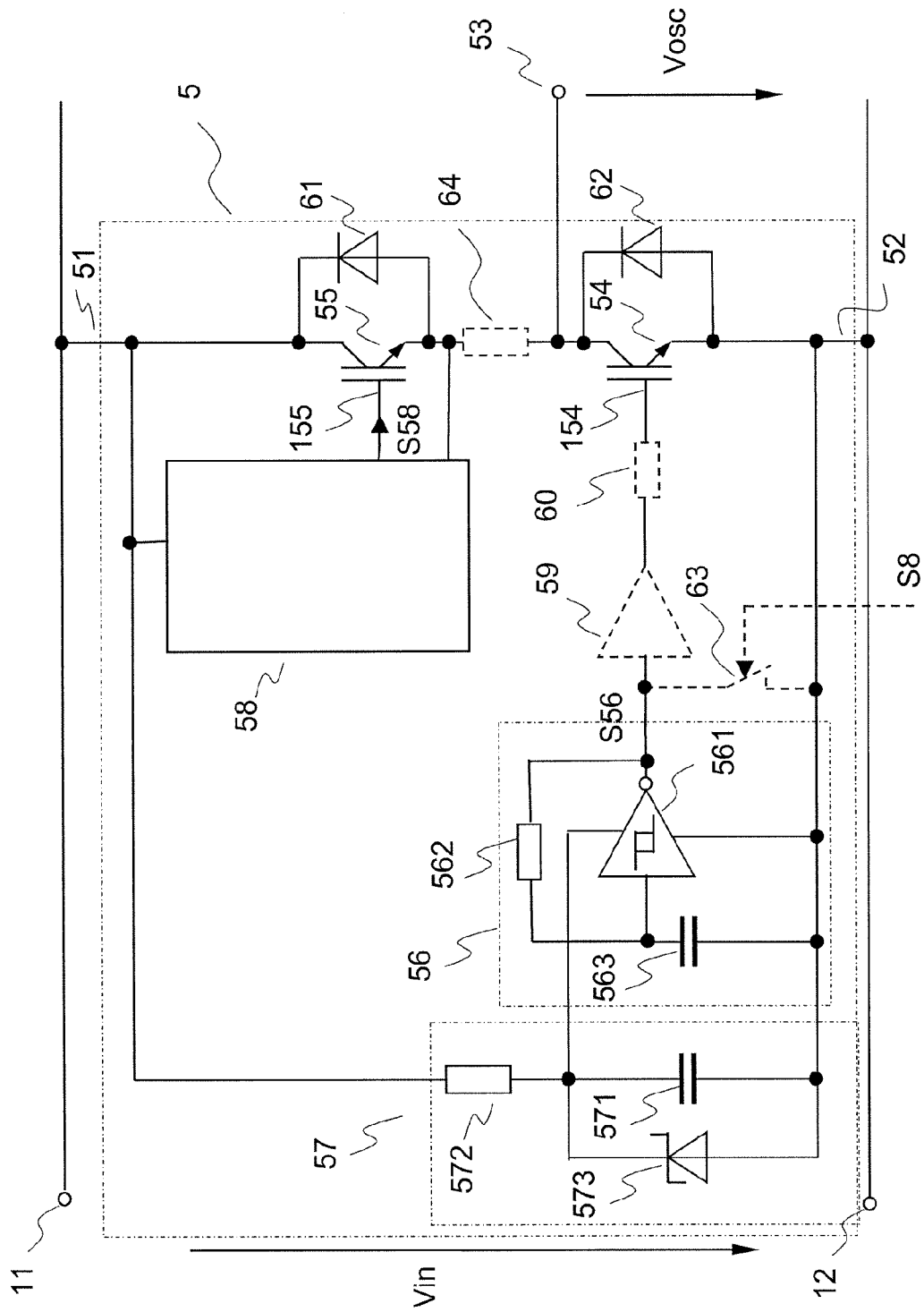
FIG. 9 illustrates one embodiment of the oscillator.

Any desired free-running oscillator circuit 5 which is suitable, upon application of a supply voltage, for generating an oscillator signal S5 oscillating between the upper and lower supply potentials is suitable as oscillator circuit 5. FIG. 9 illustrates one embodiment of an oscillator circuit 5. This oscillator circuit 5 has two semiconductor switching elements 54, 55 each having a drive terminal 154, 155 and a load path. These two semiconductor switching elements are, for example, power semiconductor switching elements. The semiconductor switching elements 54, 55 are connected in series with one another between the supply terminals 51, 52 of the oscillator 5 or the input voltage terminals 11, 12. The semiconductor switching elements 54, 55 can be semiconductor switching elements of the same type as the semiconductor switching element 2 that drives the load, but can also be any other semiconductor switching elements. The semiconductor switching elements 54, 55 are each dimensioned such that they can block the supply voltage Vin present between the input voltage terminals 11, 12. The voltage blocking capabilities of this semiconductor switching elements 54, 55 are, for example, in the range of the voltage blocking capability of the semiconductor switching element 2 for switching the load.

The semiconductor switching elements 54, 55 of the oscillator may be, in one embodiment, transistors such as e.g., IGBT, MOSFET or JFET based on silicon or based on SiC. The current-carrying capacity of these switching elements can be in the range of a few amperes or even just in the region of 1A. In the example illustrated, the semiconductor switching elements 54, 55 of the oscillator 5 are power IGBTs. Freewheeling diodes 61, 62 are optionally connected in parallel with the load paths of these power IGBTs. A circuit node lying between the load paths of the two semiconductor switching elements 54, 55 forms the oscillator output 53. In this case, said output 53 can be a circuit node common to the two load paths of the semiconductor switching elements 54, 55.

Optionally a nonreactive (ohmic) resistance element 64 may be connected in series with the load paths of the semiconductor switching elements 54, 55, the resistance element serving to limit output currents of the oscillator 5. In the case where such a nonreactive resistance element 64 is present, the circuit node common to the nonreactive resistance element 64 and the load path of the second semiconductor switching element 55 forms the oscillator output 53.

A first and a second oscillator unit 56, 58 are present for driving the first and second semiconductor switching elements 54, 55. The first oscillator unit 56 serves for driving the first semiconductor switching element 54 and generates a drive signal S56, which is fed to the drive terminal 154 of the first semiconductor switching element 54. An amplifier 59 for amplifying the drive signal S56 and a series resistor 60 are optionally connected between the first oscillator unit 56 and said drive terminal 154.

In one embodiment, the first oscillator unit 56 is a free-running (i.e., self-oscillating) oscillator unit providing an oscillating drive signal for the first semiconductor switching element 54 upon applying a supply voltage. The first oscillator unit 56 may be a logic unit, the components of which having a low voltage blocking capability. The amplitude of the drive signal S56 that is provided by the first oscillator unit 56 and the optional amplifier 59 is, for example, in the range between 5V and 15V. In the example illustrated, the first oscillator unit 56 includes an inverting Schmitt trigger 561, the output of which is fed back to the input of said Schmitt trigger via an RC element that includes a nonreactive resistor 562 and a capacitor 563. For the voltage supply of the Schmitt trigger 561, a voltage supply circuit 57 is present, which is connected between the input voltage terminals 11, 12 and, in the example illustrated, includes a series circuit including a capacitor 571 and a nonreactive resistor 572. In this case, supply voltage terminals of the Schmitt trigger 561 are connected in parallel with the capacitor 571. A voltage limiting element, such as e.g., a Zener diode 573, is optionally connected in parallel with said capacitor 571.

A rectangular-waveform oscillating drive signal S56 is available at the output of the Schmitt trigger 561, which forms the output of the first oscillator unit 56, said drive signal alternately driving the first semiconductor switching element 54 in the on-state and in the off-state. The frequency of said oscillating drive signal S56 is dependent on the RC time constant of the RC element 562, 563 and a hysteresis of the Schmitt trigger. During a cycle of the oscillating drive signal S56, the capacitor 563 is charged via the output of the Schmitt trigger until the voltage across the capacitor 563 reaches an upper hysteresis value of the Schmitt trigger. The drive signal S56 has a high level up to this point in time. Afterward, the capacitor 563, in the case of a low level of the drive signal S56, is discharged until the voltage across the capacitor 563 has fallen below a lower hysteresis value of the Schmitt trigger. At this point in time, the drive signal S56 changes again to a high level and a cycle of the drive signal begins anew by the charging of the capacitor 563.

The second oscillator unit 58 generates a drive signal S58 for the second semiconductor switching element 55. The second oscillator unit 58 is designed to generate the drive signal S58 in such a way that the second semiconductor switching element 55 is driven in the on-state after the first semiconductor switching element 54 is turned off, but that the second semiconductor switching element 55 is driven in the off-state before the first semiconductor switching element 54 is actually turned on again. For this purpose the second oscillator unit 58 includes, for example, only passive circuit components, such as resistances, capacitances and diodes, and generates the drive signal S58 dependent on the electrical potential at a circuit node, common to the first and the second semiconductor switching element 54, 55, and dependent on the switching state of the second semiconductor switching element 55.

Figure 10:
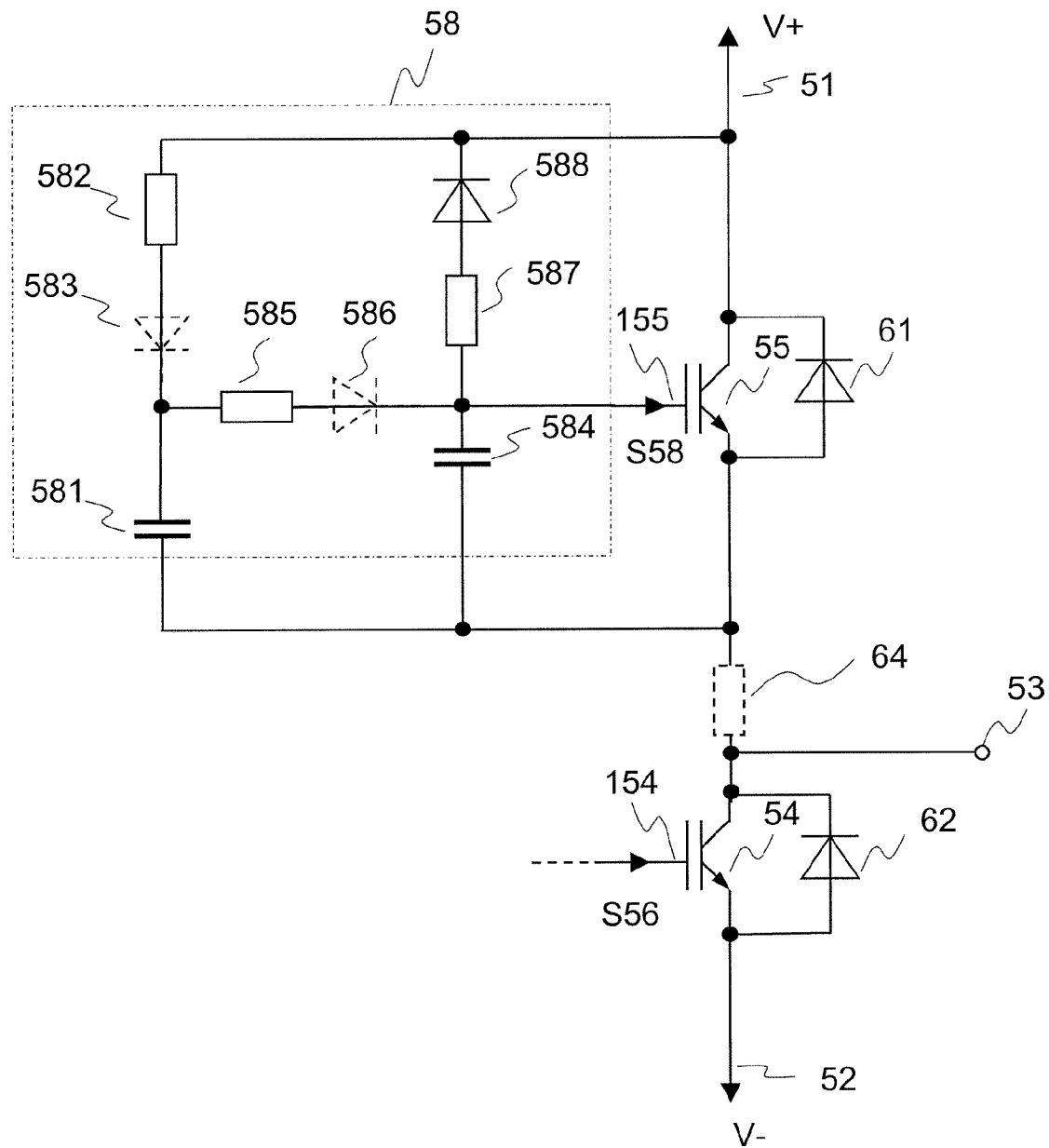
FIG. 10 illustrates a first embodiment of an oscillator unit of the oscillator.

An example of such a second oscillator unit 58 is illustrated in FIG. 10. This second oscillator unit 58 includes a first series circuit including a first capacitive storage element 581 and a first resistor 582, said first series circuit being connected in parallel with the load path of the first semiconductor switching element 55. The second oscillator unit 58 additionally has a second series circuit including a second capacitive storage element 584 and a second resistor 585, said second series circuit being connected in parallel with the first capacitive storage element 581. In this case, the second capacitive storage element 584 is connected between the drive terminal 155 and the second load path terminal of the second semiconductor switching element 55. In this case, a voltage across the second capacitive storage element 584 corresponds to the drive signal S58. A node common to the second capacitive storage element 584 and the drive terminal 155 of the second semiconductor switching element 55 is additionally connected via a third resistor 587 and a rectifier element 588 to the second load path terminal of the second semiconductor switching element 55 or the supply terminal for the positive supply potential V+.

The functioning of this second oscillator unit 58 is briefly explained below: the first capacitive storage element 581 is charged in each case when the second semiconductor switching element 55 is turned off and the first semiconductor switching element 54 is turned on. In this case, the rate at which the first capacitive storage element 581 is charged or at which a voltage across the first capacitive storage element 581 rises is dependent on an RC time constant of a first RC element formed by the first capacitive storage element 581 and the first resistor 583. In this case, said RC time constant is coordinated with the switched-on duration of the first semiconductor switching element 54 such that a voltage across the first capacitive storage element 581 can rise during said switched-on duration to a voltage required for driving the second semiconductor switching element 55 in the on-state.

The second capacitive storage element 584 and the second resistor 585 form a delay element. This delay element has the effect that the second semiconductor switching element 55 is driven in the on-state only in a time-delayed manner with respect to a point in time at which the voltage at the first capacitive storage element 581 has risen to a value sufficient for driving the second semiconductor switching element 55 in the on-state. This time delay is adapted to the RC time constant of a second RC element formed by the first capacitive storage element 581 and the first resistor 582 and to the switched-on duration of the first semiconductor switching element in such a way that the second semiconductor switching element 55 is turned on only when the first semiconductor switching element 54 is turned off.

If the second semiconductor switching element 55 is turned on after the first semiconductor switching element 54 is turned off, then the electrical potential at the second load path terminal of the second semiconductor switching element 55 rises to a value which corresponds to the positive supply potential V+ minus the load path voltage present across the load path of the first semiconductor switching element 55. In this case, the voltage across the second capacitive storage element 584 is initially higher than the load path voltage, such that the capacitive second storage element 584 and also the capacitive first storage element 581 are discharged. In this case, the second semiconductor switching element 55 remains driven in the on-state until the voltage across the second capacitive storage element 584 has fallen below the value of the threshold voltage of said second semiconductor switching element 55.

In this case, the discharge rate of the second capacitive storage element 584 is dependent, inter alia, on the RC time constant of an RC element formed by the second capacitive storage element 584 and the third resistor 587 and is coordinated with the switched-off duration of the first semiconductor switching element 54 in such a way that the second semiconductor switching element 55 is turned off before the first semiconductor switching element starts to be tuned on again.

A second rectifier element 583 is optionally connected in series with the first capacitive storage element 581 in such a way that the first capacitive storage element 581 can be discharged only via the second and third resistors 585, 587, which leads to a lengthening of the switched-on duration of the second semiconductor switching element 55 in comparison with the variant in which such a rectifier element is not present, such that the first capacitive storage element 581 is also discharged via the first resistor 582. A third rectifier element 586 is furthermore optionally connected in series with the second resistor 585 in such a way that the second capacitive storage element 584 can be discharged only via the third resistor 587.

Figure 11:
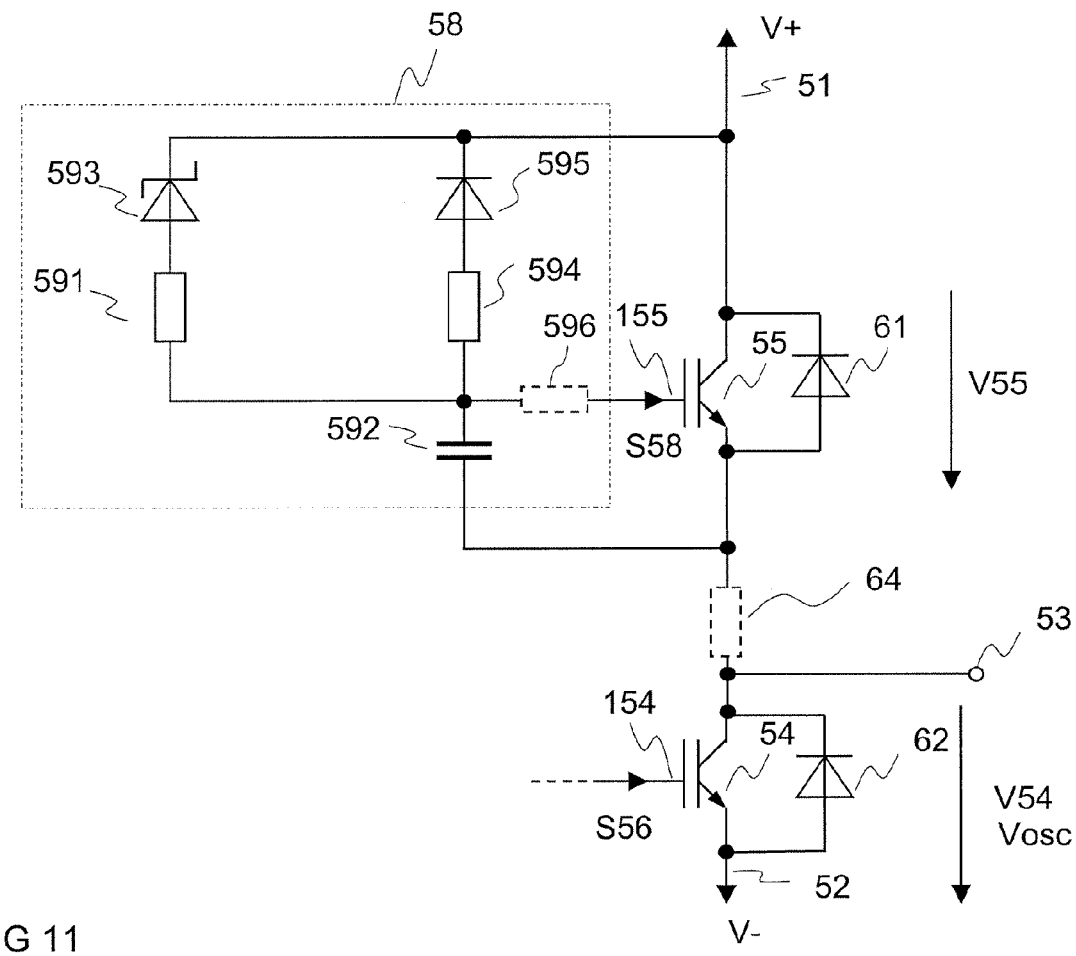
FIG. 11 illustrates a second embodiment of an oscillator unit of the oscillator.

FIG. 11 illustrates a further embodiment of a second oscillator unit 58 for generating the drive signal S58 for the second semiconductor switching element 55. The second oscillator unit 58 includes a first RC element including a series circuit with a first resistor 591 and a capacitive storage element 592. The RC element is connected between the load terminals of the second semiconductor switching element 55 and includes a tap connected to the control terminal 155 of the second semiconductor switching element 55. The capacitive storage element 592 of the RC element is connected between the control terminal 155 and the second load terminal of the second semiconductor switching element 55, so that the voltage present across the capacitive storage element 592 is the drive voltage or the drive signal S58, respectively, of the second semiconductor switching element 55. A further resistor 596 is optionally connected between the tap of the RC member and the control terminal 155 of the second semiconductor switching element 55, the further resistor 596 effecting that the gate-emitter capacitance of the second semiconductor switching element 55 is charged slightly time-delayed to the capacitive storage element 592. A Zener diode 593 is connected in series to the RC member. This Zener diode 593 is interconnected such that at a current through RC member 591, 593 flows only if the load-path voltage V55 of the second semiconductor switching element 55 is higher than a breakthrough-voltage of the Zener diode 593.

The second oscillator unit 58 according to FIG. 11 further includes a second RC member that is formed by a capacitive storage element 592 and a second resistor 594, and that is connected in series to a rectifier element 595, such as a diode, between the load-path terminals of the second semiconductor switching element 55. The rectifier element 595 is interconnected such, that the capacitive storage element 592 can be discharged when the second semiconductor switching element 55 is conducting.

Figure 12:
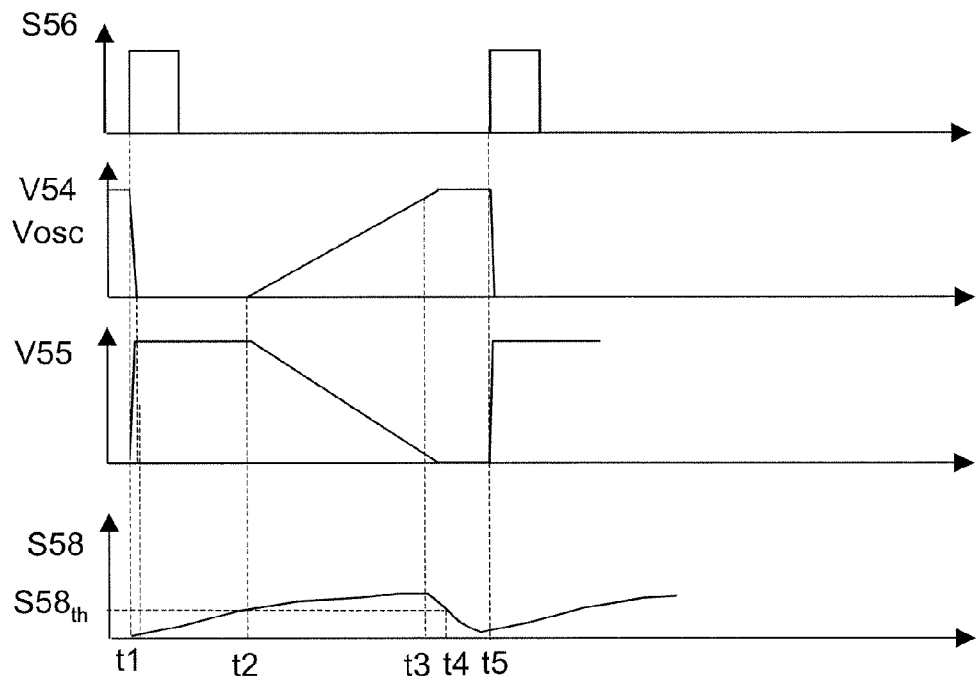
FIG. 12 illustrates one embodiment of the function of the oscillator unit according to FIG. 11 by way of timing diagrams.

The functioning of an oscillator having a second oscillator unit 58 according to FIG. 11 will be explained in the following with reference to FIG. 12, in which examples of timing diagrams of the first drive signal S56 for the first semiconductor switching element 54, a load-path voltage V54 of the first semiconductor switching element 54, the drive signal S58 of the second semiconductor switching element 55, and the load-path voltage V55 of the second semiconductor switching element 55 are illustrated. In FIG. 12 t1 denotes a time at which both semiconductor switching element 54, 55 block (are switching off), and at which the first drive signal S56 assumes an on-level. Through this, the first semiconductor switching element 54 is driven in its on-state, so that its load-path voltage V54 (that corresponds to the output voltage Vosc of the oscillator) decreases. With the load-path voltage V54 of the first semiconductor switching element 54 decreasing the load-path voltage V55 of the second semiconductor switching element 55 increases. When this load-path voltage V55 rises above the breakthrough-voltage of the Zener diode 593 a charging process starts, through which a capacitive storage element 592 is charged via the Zener diode 593 and the first resistor 591. During this charging process the voltage across the capacitive storage element 592 increases, i.e., the drive signal S58 increases. During this charging process the voltage across the capacitive storage element 592 corresponds to the load-path voltage V55 minus the breakthrough-voltage (Zener voltage) of the Zener diode 593, and minus a voltage drop across the first resistance element 591, this voltage drop being effected by the charging current of the capacitive storage element 592.

When the drive signal (or the drive voltage S58, respectively) reaches a threshold value S58$_{th}$, that corresponds to the threshold voltage of the second semiconductor switching element 55, the second semiconductor switching element 55 starts to conduct. t2 in FIG. 12 denotes the time at which the drive signal S58 reaches the threshold value S58$_{th}$. The RC time constant of the first RC element 591, 592 and the duration during which the first semiconductor switching element 54 is conducting during a switching cycle are adapted to one another in such a way that the first semiconductor switching element 54 is already blocking at the time when the second drive signal S58 reaches the threshold value S58$_{th}$. The output 53 of the oscillator is capacitively loaded, so that the output voltage V54, Vosc stays on a low voltage level, even after the first semiconductor switching element 54 blocks. The capacitive loading of the output of the oscillator results from the circuitry connected to the oscillator (that has been explained above), and from parasitic capacitances, such as the output capacitance (collector-emitter capacitance in an IGBT, and drain-source capacitance in an MOSFET) of the first semiconductor switching element 54.

When the second semiconductor switching element 55 starts conducting at time t2, then a recharging process at the output 53 of the oscillator starts, i.e., the output voltage V54, Vosc starts to increase. The rate at which the output voltage V54, Vosc increases is dependent on the rate at which the capacitive storage element 592 is further charged via resistor 591. With decreasing load-path voltage V55 the further charging process of the capacitive storage element slows down. Charging the capacitive storage element 592 via the Zener diode 593 and the first resistor 591 ends, when the load-path voltage V55 drops below a value that corresponds the sum of the breakthrough-voltage of the Zener diode 593 and the drive voltage S58 across the capacitive storage element 592.

If the second semiconductor switching element 55 is driven in its on-state to such an extent that the load path voltage V55 is smaller than the voltage across the capacitive storage element 592, i.e., smaller than the drive signal S58, then the capacitive storage element 592 is discharged via the second resistor 594, diode 595, and the load path of the second semiconductor switching element 55. This is illustrated in FIG. 12 at time t3 (drive signal S58 and the load-path voltage V55 are differently scaled in FIG. 12). A part of the discharge current can flow through the first resistor 591 and the Zener diode 593. However, the resistance value of the second resistor 594 may be selected to be significantly higher than the resistance value of the first resistor 591, only a small part of the discharge current flowing trough the leg including the first resistor 591 in this case.

The load-path voltage V55 of the second semiconductor switching element V55 can further decrease after the end of the charging process of the capacitive storage element 592. This is mainly effected by the capacitive load at the output of the oscillator, but may also be effected by parasitic capacitive effects and resistor 596. A change in the load state of the capacitive storage element 592 does therefore not immediately affect the load-path voltage V55 of the second semiconductor switching element 55. The presence of the Zener diode 593 results in a hysteresis in such a way that a charging process of the capacitive storage element 592 ends at a value of the load path voltage V55, this value being higher than a value for which the discharging process starts.

At a time t4 the drive signal S58 has again fallen to the threshold value with S58$_{th}$, so that the second semiconductor switching element 55 again blocks at this time. Due to the capacitive loading of the output 55 (that has been explained above) the load path voltage V55 of the second semiconductor switching element 55 stays at a low signal level until the first semiconductor switching element 55 is again switched on at the beginning of a new switching cycle. Time t6 in FIG. 12 denotes the beginning of such a new switching cycle. A period duration of the output signal Vosc provided by the oscillator is given by the first oscillator unit 56 that drives the first semiconductor switching element 54. The driving in the on-state and off-state of the second semiconductor switching element 55 is dependent on the driving in the on-state and the off-state of the first semiconductor switching element 54. RC time constants of the second oscillator unit 58 are adapted to the period duration of the oscillator signal S56 provided by the first oscillator unit 56 in such a way that the capacitive storage element 592 during one cycle is charged to such an extent that the second semiconductor switching element 55 conducts, and is afterwards discharged to such and extent that the second semiconductor switching element 55 blocks, before the first semiconductor switching element 54 is again switched-on.

In the case of the circuit arrangements explained above, the coupling circuit 7, the voltage supply circuit 4 and the drive circuit 3 form a voltage supply and drive unit for the semiconductor switching element 2. This voltage supply and drive unit is designated by the reference symbol 10 in FIG. 1.

It goes without saying that, in a circuit arrangement, it is possible to provide a plurality of semiconductor switching elements having such a voltage supply and drive unit, wherein the individual voltage supply and drive units are connected to the oscillator output 53.

Figure 13:
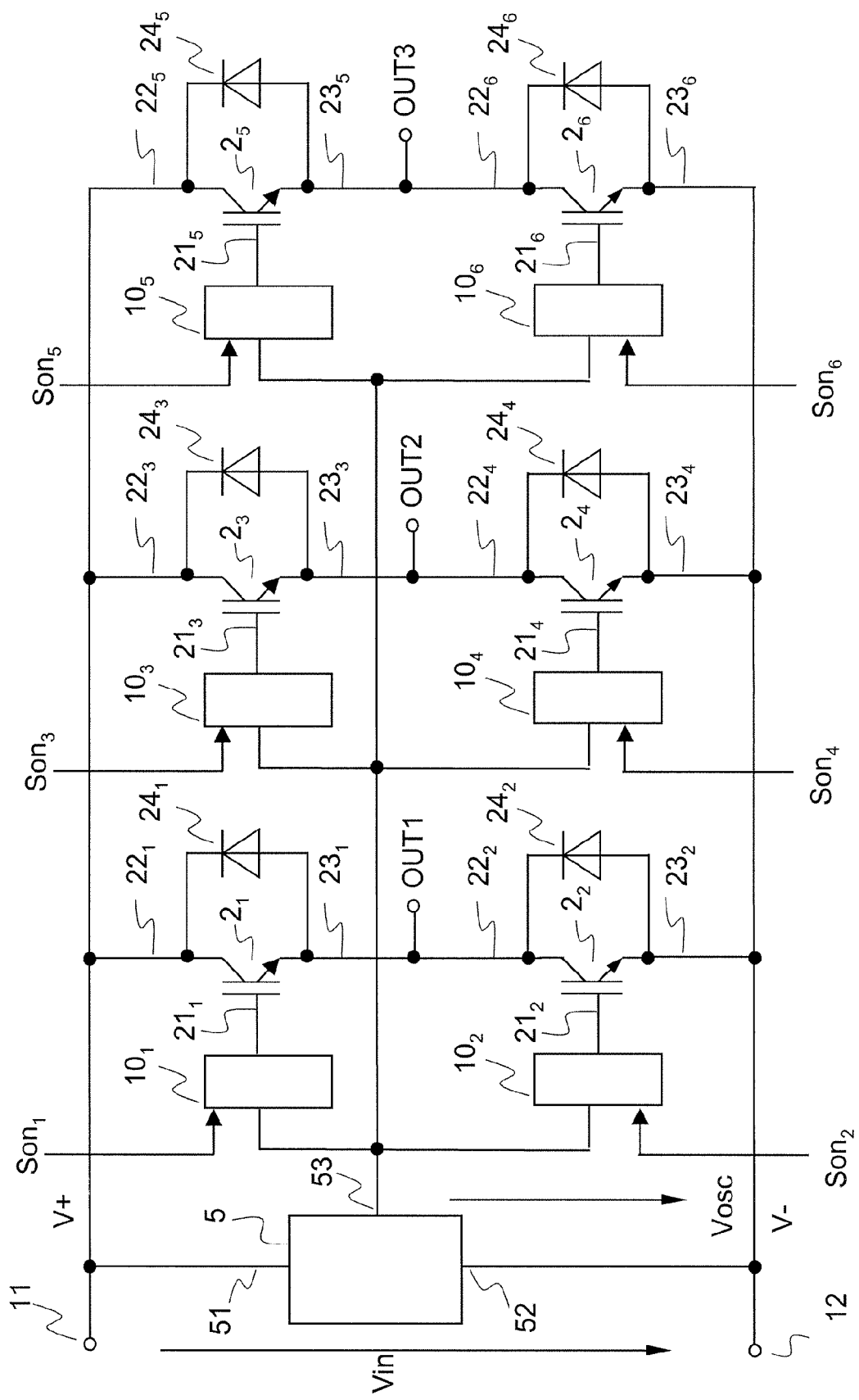
FIG. 13 illustrates one embodiment of a circuit arrangement realized as a three-phase converter, said circuit arrangement having six semiconductor switching elements each having a drive circuit.

FIG. 13 illustrates one embodiment of a 3-phase converter having three half-bridge circuits: a first half-bridge circuit having a first and a second power semiconductor switching element $2_1$, $2_2$, the load paths $22_1$-$23_1$, $22_2$-$23_2$ of which are connected in series with one another between the input voltage terminals 11, 12; a second half-bridge circuit having a third and a fourth power semiconductor switching element $2_3$, $2_4$, the load paths $22_3$-$23_3$, $22_4$-$23_4$ of which are connected in series with one another between the input voltage terminals 11, 12; and a third half-bridge circuit having a fifth and a sixth power semiconductor switching element $2_5$, $2_6$, the load paths $22_5$-$23_5$, $22_6$-$23_6$ of which are connected in series with one another between the input voltage terminals 11, 12. The individual half-bridges respectively have output terminals OUT1, OUT2, OUT3, which are formed in each case by those circuit nodes which are common to the load paths of the power semiconductor switching elements of the individual half-bridges. A 3-phase load, such as e.g., a 3-phase electric motor, can be connected to said output terminals, which are also referred to as phase outputs, in a sufficiently known manner.

The individual semiconductor switching elements, which are realized as power IGBTs in the example illustrated, are driven via drive terminals $21_1$-$21_6$ by using voltage supply and drive units $10_1$-$10_6$. These voltage supply and drive units $10_1$-$10_6$ can be realized in accordance with the voltage supply and drive units explained above and are respectively connected to the oscillator output 53 of the oscillator 5. Switching signals $Son_1$-$Son_6$ can be fed to the individual voltage supply and drive units $10_1$-$10_6$, said switching signals being generated by a central control circuit (not illustrated) and determining the temporal sequence of the driving of the individual semiconductor switching elements. If, as illustrated in FIG. 13, a plurality of voltage supply and drive units $10_1$-$10_6$ are present, then the oscillator 5 can be deactivated in the manner explained with reference to FIGS. 7 and 8 for example when a sufficient supply voltage is present in all the voltage supply and drive units or when a sufficient supply voltage is present in just one of the voltage supply and drive units. It goes without saying that any desired combinations are also conceivable.

The individual voltage supply and drive units can have capacitive (cf. FIG. 3) or inductive coupling circuits (cf. FIG. 4). If inductive coupling circuits are used, then the primary winding of each coupling circuit can be connected in series with a capacitance between the oscillator output and one of the input terminals. Furthermore, there is also the possibility of connecting a plurality of the primary windings in series with one another and with a capacitance between the oscillator output 53 and one of the input terminals 11, 12.

Figure 14:
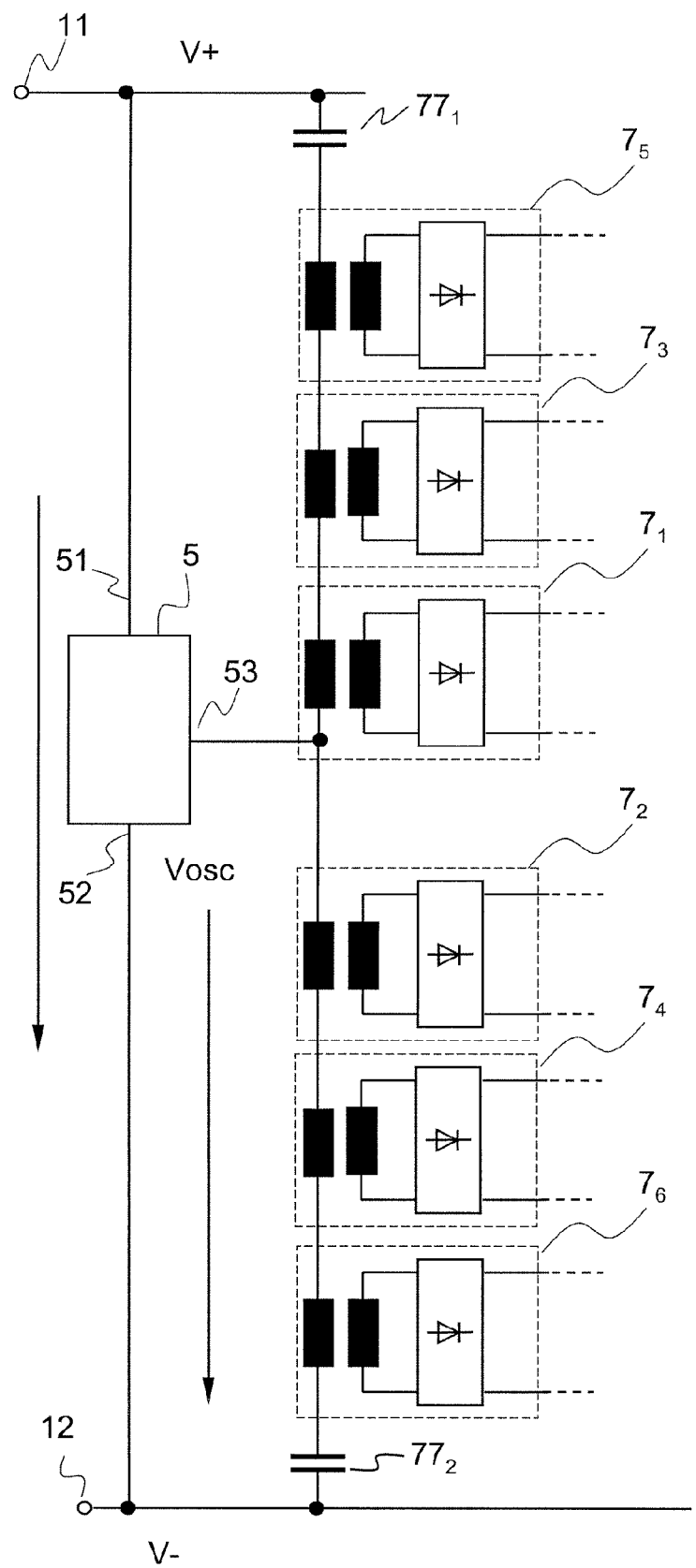
FIG. 14 illustrates part of a further example of a three-phase converter.

Referring to FIG. 14, which illustrates only the oscillator circuit 5 and the coupling circuits $7_1$-$7_6$ of the voltage supply and drive circuits $10_1$-$10_6$, in a further example provision is made for connecting the primary windings of the coupling circuits $7_1$, $7_3$, $7_5$ for the high-side switches $2_1$, $2_3$, $2_5$ in series with one another and with a capacitance $77_1$ between the oscillator output 53 and the first input terminals 11, and for connecting the primary windings of the coupling circuits $7_2$, $7_4$, $7_6$ for the low-side switches $2_2$, $2_4$, $2_6$ in series with one another and with a capacitance $77_2$ between the oscillator output 53 and the second input terminal 12.

Finally, it should be pointed out that circuit features which have been explained only in terminal with one example can be combined with circuit features from other examples even when this has not been explicitly explained previously. Thus, in one embodiment, features which are presented in any of the following claims can be combined with features of any other claims.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
   first and second input voltage terminals for applying an input voltage;
   at least one first semiconductor switching element having a drive terminal and a load path, the load path being connected between the input voltage terminals;
   a drive circuit having supply terminals for receiving a supply voltage, and having a drive output connected to the drive terminal of the at least one semiconductor switching element;
   a free-running oscillator having supply terminals, and an oscillator output, the oscillator being connected between the first and second input voltage terminals by using its supply terminals, the oscillator being designed to generate an oscillating output voltage at the oscillator output;
   a voltage supply circuit having input terminals for receiving the oscillating output voltage or a voltage dependent on the oscillating output voltage, and having output terminals for providing the supply voltage of the drive circuit; and
   at least one series circuit comprising a rectifier element and a capacitive storage element, said at least one series circuit being connected between the input terminals of the voltage supply circuit.

2. The circuit arrangement of claim 1, further comprising:
   a coupling circuit connected between the oscillator output and the input terminals of the voltage supply circuit.

3. The circuit arrangement of claim 2, wherein the coupling circuit is a capacitive coupling circuit having a capacitance, the capacitance being connected between the oscillator output and one of the input terminals of the voltage supply circuit.

4. The circuit arrangement of claim 2, wherein the coupling circuit is an inductive coupling circuit comprising:
a transformer having a primary winding connected to the oscillator output, and having a secondary winding connected to the input terminals of the voltage supply circuit.

5. The circuit arrangement of claim 4, wherein a capacitance is connected in series with the primary winding, wherein the series circuit comprising the primary winding and the capacitance is connected between the oscillator output and one of the input voltage terminals.

6. The circuit arrangement of claim 1, furthermore comprising:
a second semiconductor switching element having a drive terminal and a load path, the load path being connected in series with the load path of the first semiconductor switching element between the input voltage terminals;
a second drive circuit, having supply terminals for receiving a supply voltage and having a drive output, the drive output being connected to the drive terminal of the second semiconductor switching element;
a second voltage supply circuit having input terminals for receiving the oscillating output voltage or a voltage dependent on said oscillating output voltage, and having output terminals for providing the supply voltage of the second drive circuit.

7. A method comprising providing a circuit arrangement of claim 1, and using the circuit arrangement in a half-bridge circuit having a further semiconductor switching element in addition to the at least one semiconductor switching element, said further semiconductor switching element being connected in series with the at least one semiconductor switching element.

8. A circuit arrangement comprising:
first and second input voltage terminals for applying an input voltage;
at least one first semiconductor switching element having a drive terminal and a load path, the load path being connected between the input voltage terminals;
a drive circuit having supply terminals for receiving a supply voltage, and having a drive output connected to the drive terminal of the at least one semiconductor switching element;
a free-running oscillator having supply terminals, and an oscillator output, the oscillator being connected between the first and second input voltage terminals by using its supply terminals, the oscillator being designed to generate an oscillating output voltage at the oscillator output;
a voltage supply circuit having input terminals for receiving the oscillating output voltage or a voltage dependent on the oscillating output voltage, and having output terminals for providing the supply voltage of the drive circuit; and
at least one series circuit comprising a rectifier element and a capacitive storage element, said at least one series circuit being connected between the input terminals of the voltage supply circuit, wherein the capacitive storage element is coupled to the output terminals of the voltage supply circuit.

9. The circuit arrangement of claim 8, wherein the voltage supply circuit comprises a voltage regulating circuit connected between the capacitive storage element and the output terminals.

10. The circuit arrangement of claim 8, wherein the voltage supply circuit comprises:
a first series circuit comprising a first rectifier element and a first capacitive storage element, said first series circuit being connected between the input terminals, wherein the first capacitive storage element is coupled to a first of the output terminals;
a second series circuit comprising a second rectifier element and a second capacitive storage element, said second series circuit being connected between the input terminals, wherein the second capacitive storage element is coupled to a second of the output terminals.

11. The circuit arrangement of claim 8, wherein the voltage supply circuit furthermore comprises:
a first voltage regulating circuit, which is connected between the first capacitive storage element and the first output terminal;
a second voltage regulating circuit, which is connected between the second capacitive storage element and the second output terminal.

12. The circuit arrangement of claim 1, wherein one of the inputs of the voltage supply circuit is connected to one of the input voltage terminals via a charge pump.

13. The circuit arrangement of claim 12, wherein the charge pump is connected in parallel with the load path of the semiconductor switching element.

14. The circuit arrangement of claim 1, further comprising a deactivation circuit which is designed to deactivate the oscillator if the supply voltage or a voltage from which the supply voltage is derived exceeds a predetermined reference value.

* * * * *